(12) United States Patent
Domercq et al.

(10) Patent No.: US 9,397,304 B2
(45) Date of Patent: Jul. 19, 2016

(54) ORGANIC PHOTONIC DEVICE

(71) Applicant: AGC GLASS EUROPE, Louvain-La-Neuve (BE)

(72) Inventors: Benoit Domercq, Braine-l'Alleud (BE); Philippe Roquiny, Johnson City, TN (US)

(73) Assignee: AGC Glass Europe, Louvain-La-Neuve (BE)

( * ) Notice: Subject to any disclaimer, the term of this patent is extended or adjusted under 35 U.S.C. 154(b) by 0 days.

(21) Appl. No.: 14/399,729

(22) PCT Filed: May 8, 2013

(86) PCT No.: PCT/EP2013/001363
§ 371 (c)(1),
(2) Date: Nov. 7, 2014

(87) PCT Pub. No.: WO2013/167270
PCT Pub. Date: Nov. 14, 2013

(65) Prior Publication Data
US 2015/0115246 A1    Apr. 30, 2015

(30) Foreign Application Priority Data
May 8, 2012    (BE) .................................. 2012/0305

(51) Int. Cl.
*H01L 31/0224*    (2006.01)
*H01L 51/52*    (2006.01)
(Continued)

(52) U.S. Cl.
CPC ............ *H01L 51/0096* (2013.01); *C03C 17/36* (2013.01); *C03C 17/366* (2013.01); *C03C 17/3639* (2013.01); *C03C 17/3644* (2013.01);
(Continued)

(58) Field of Classification Search
CPC ............ C03C 17/3639; C03C 17/3644; C03C 17/366; C03C 17/3613; C03C 17/36; C03C 17/36939; H01L 31/022466; H01L 51/5265; H01L 51/5215
See application file for complete search history.

(56) References Cited

U.S. PATENT DOCUMENTS 4,799,745 A * 1/1989 Meyer ............... B32B 17/10174
                                                        204/192.27
4,859,532 A * 8/1989 Oyama ................... C03C 17/36
                                                        428/336
(Continued)

FOREIGN PATENT DOCUMENTS

JP    9-236811 A    9/1997
KR    2002-0088488 A    11/2002
(Continued)

*Primary Examiner* — Marvin Payen
*Assistant Examiner* — Jeremy Joy
(74) *Attorney, Agent, or Firm* — Oblon, McClelland, Maier & Neustadt, L.L.P

(57) ABSTRACT

The invention relates to a transparent substrate for an organic light-emitting device comprising an electrode-bearing carrier, said electrode consisting in a multilayer comprising at least, in order starting from the substrate, a first dielectric layer (D1), a first conduction metal layer (M1), a second dielectric layer (D2), a second conduction metal layer (M2), and a third dielectric layer (D3), the conduction metal layers (M) in the electrode (11) being two in number, and the third dielectric layer (D3) not comprising an indium-oxide-based layer. It is characterised in that the geometric thickness of the second dielectric layer (D2) is at least 65 nm and the geometric thickness of the first conduction metal layer (M1) is at least 8.5 nm.

14 Claims, 2 Drawing Sheets

Figure 1:
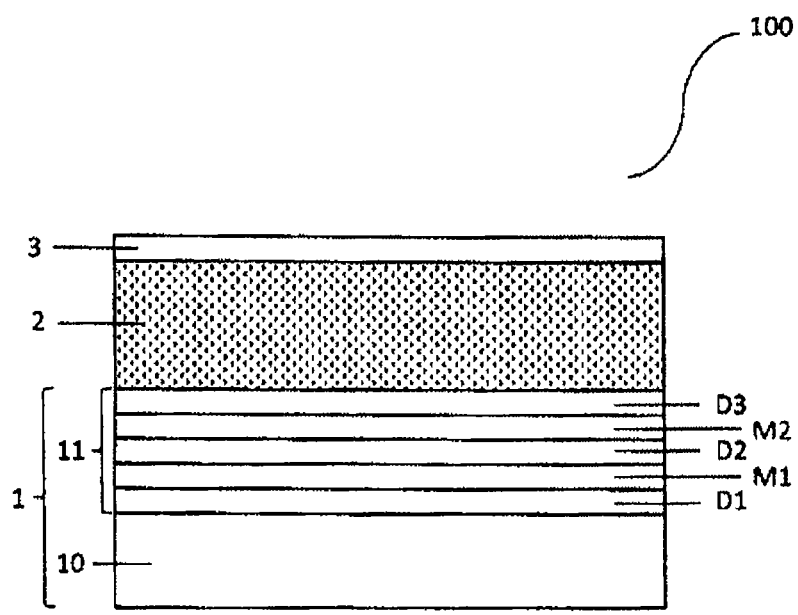

(51) Int. Cl.
*C03C 17/36* (2006.01)
*H01L 51/00* (2006.01)
*H05K 1/02* (2006.01)
*H05K 1/09* (2006.01)

(52) U.S. Cl.
CPC .... *H01L 31/022466* (2013.01); *H01L 51/5203* (2013.01); *H01L 51/5215* (2013.01); *H05K 1/0274* (2013.01); *H05K 1/09* (2013.01); *H01L 2251/558* (2013.01)

(56) References Cited

U.S. PATENT DOCUMENTS

| | | | |
|---|---|---|---|
| 4,965,121 A * | 10/1990 | Young | B32B 17/10174 359/360 |
| 4,996,105 A | 2/1991 | Oyama et al. | |
| 5,413,864 A * | 5/1995 | Miyazaki | C03C 17/36 359/350 |
| 5,763,064 A * | 6/1998 | Suzuki | C03C 17/36 359/360 |
| 6,040,056 A | 3/2000 | Anzaki et al. | |
| 6,333,592 B1 * | 12/2001 | Sasa | C03C 17/36 313/110 |
| 6,919,133 B2 * | 7/2005 | Hartig | C03C 17/36 428/428 |
| 7,187,116 B2 * | 3/2007 | Lee | H01L 51/5265 313/503 |
| 2008/0105298 A1 * | 5/2008 | Lu | H01L 31/022425 136/256 |
| 2008/0164812 A1 * | 7/2008 | Tsai | H01L 51/5262 313/509 |
| 2009/0126791 A1 * | 5/2009 | Lu | B32B 17/10036 136/258 |
| 2009/0194157 A1 * | 8/2009 | den Boer | H01L 31/022466 136/256 |
| 2011/0037379 A1 | 2/2011 | LeCamp et al. | |
| 2014/0332795 A1 * | 11/2014 | Guimard | C03C 17/36 257/40 |

FOREIGN PATENT DOCUMENTS

| | | |
|---|---|---|
| WO | 2009/078682 A2 | 6/2009 |
| WO | 2009/083693 A2 | 7/2009 |

* cited by examiner

ORGANIC PHOTONIC DEVICE

The present invention relates to photonic devices, in particular organic photonic devices. Photonic device means any type of device capable of emitting or collecting light. Such devices are for example optoelectronic devices such as the organic electroluminescent devices known by the acronym OLED (Organic Light Emitting Device) or else light-collecting devices such as organic photovoltaic cells, also called solar cells.

Organic electroluminescent devices generally comprise a substrate, an electrode arranged on the substrate for supplying charges of a first polarity, an electrode arranged on the other side of the device for supplying charges of a second polarity opposite to the first, organic charge-transporting semiconducting layers and electroluminescent layers arranged between the electrodes, and an encapsulation system. OLEDs may be used for lighting, whether architectural or decorative, of the backlighting type, or for information signs. OLEDs emitting white light are generally preferred for these applications.

The present invention relates more particularly to a transparent electrode for an organic electroluminescent device.

For the purpose of manufacturing an OLED device emitting white light for lighting applications, it is necessary to manufacture a light source with a color rendering index (CRI) that is as high as possible.

The color rendering index (CRI) is a quantitative measure of the capacity of a light source for faithfully reproducing the colors of various objects in comparison with an ideal or natural light source. Light sources with a high CRI are desirable in most lighting applications as they improve perception of the shades of color of illuminated objects. The color rendering index is defined by the International Commission on Illumination (CIE, for Commission Internationale de l'Éclairage) as the effect of an illuminant on the chromatic appearance of the objects that it illuminates, said appearance being compared consciously or not with that of the same objects illuminated by a reference illuminant, as defined in the following works: "CIE 17.4-1987 International Lighting Vocabulary" or Nickerson, Dorothy; Jerome, Charles W. (April 1965), "Color Rendering of light sources: CIE method of specification and its application", Illuminating Engineering (IESNA) 60 (4): 262-271.

The use of layers of tin-doped indium oxide (ITO: Indium Tin Oxide) or of other conductive layers or multilayers (for example, a layer of fluorine-doped tin oxide or an assembly of layers comprising a silver-based metallic layer) as the transparent electrode for OLEDs is known. Multilayers similar to those used in the stacks on glass intended for thermal management of buildings, trains or automobiles may be preferred as they offer the opportunity for greatly improving the conduction properties relative to layers of ITO for reasonable electrode thicknesses.

However, when conductive multilayers comprise a single silver-based metallic layer, problems of angular stability of the color emitted may arise. One solution is then to use multilayers similar to the architectural sun-screening products containing two silver-based metallic layers as described in document WO2009083693. This document discloses the use of conductive structures comprising two layers of silver for OLED devices. The use of this type of structure in an OLED device is described there as making it possible to limit the angular dependence of the polychromatic emission spectrum of said device.

However, this concept of angular stabilization is conventional for architectural layers and the solution presented in that document is not optimized for use in an OLED device. In fact it seemed to us that the use of such layers does not make it possible to obtain, for OLED devices, suitable light sources that are optimized in particular in terms of color rendering index (CRI), notably with "conventional high-performance organic stacks". "Conventional high-performance organic stack" means that the organic part of the device is chosen to be "thick", i.e. at least two of the different emitting sources (red, green, blue, yellow) are separated from one another by an organic separating layer. Moreover, multilayers comprising three silver-based metallic layers, known for architectural applications, are not optimal for use in an OLED device. In fact it seemed to us that these layers could display excessive light absorption, and so might reduce the efficiency of the optoelectronic device.

The aim of the present invention is the selection of conductive structures comprising two silver-based layers for OLED devices, said selection allowing the best possible combination of a high CRI, high luminance (i.e. a large amount of light emitted, or a high efficiency), and low variability of color depending on the angle of observation (color Delta) to be obtained for these OLED devices.

Color Delta combines the color variation along the Planckian locus and orthogonally to the latter. The Planckian locus combines the points of emission of the various Planckian sources and is therefore close to the majority of the standard white-light sources (for example, the illuminants D65, C, A). For devices emitting white or almost white light, it is therefore advisable to impose a greater penalty on the orthogonal color differences relative to this curve of the Planckian locus as they move farther away from white.

Color Delta is thus represented by the following formula:

$$\Delta_{col} = \sqrt{\sum_i^n \frac{(x_i - \bar{x})^2}{s_x} + \sum_i^n \frac{(y_i - p_i)^2}{s_y}}$$

$$p_i = p(x_i)$$
$$= 0.404783758262229 + 0.290077294746671 *$$
$$(x_i - 0.443946335246864) -$$
$$2.58208279488139 * (x_i - 0.443946335246864)^\wedge 2 -$$
$$0.406419069828599 * (x_i - 0.443946335246864)^\wedge 3$$

$$s_x = 0.0011 * n$$
$$s_y = 0.00044 * n$$

in which
- n is the number of data points (with n≥5, distributed over a range from 0 to 60°).
- p(x) is a cubic approximation of the Planckian locus and the choice of the two scale constants implies that variations parallel to the Planckian locus are penalized 2.5 times less than the variations orthogonal to the Planckian locus. This choice favors the angular paths near the Planckian locus relative to the other angular paths.
- $x_i$ and $y_i$ are the chromatic coordinates in the CIE 1931 system, at each angle i.

According to one of its aspects, the present invention relates to a transparent substrate for an organic electroluminescent device as claimed in claim 1, the dependent claims presenting preferred embodiments.

The invention relates to a transparent substrate for an organic electroluminescent device comprising a support bearing an electrode, said electrode consisting of a stack of layers comprising at least, in order starting from the substrate, a first dielectric layer (D1), a first metallic conduction layer (M1), a second dielectric layer (D2), a second metallic conduction layer (M2) and a third dielectric layer (D3), the number of metallic conduction layers (M) in the electrode being two, and the third dielectric layer (D3) not comprising a layer based on indium oxide. It is characterized in that the geometric thickness of the second dielectric layer (D2) is at least 65 nm and the geometric thickness of the first metallic conduction layer (M1) is at least 8.5 nm.

Substrates of this kind with electrodes of this kind have the advantage, once integrated in OLED devices, of offering the best possible compromise between high CRI, high luminance (i.e. high efficiency), and low variability of color depending on the angle of observation. Although transparent substrates for organic electroluminescent devices exist, offering better results for one of these properties, we found that only a quite particular choice of thickness of the second dielectric and of the first metallic conduction layer of the electrode offered high CRI, high luminance and low color Delta, or better color stability according to the angle.

Moreover, we found that this choice was particularly suitable for integration in an OLED device whose organic part is a conventional high-performance organic stack, in which at least two of the different emitting sources (red, green, blue, yellow) are separated from one another by an organic separating layer.

The substrate of the present invention is said to be transparent, i.e. it displays light absorption of at most 50%, or even of at most 30%, preferably of at most 20% or at most 15%, more preferably at most 12% or at most 10% in the wavelength range of visible light. The substrate of the present invention comprises a support and an electrode.

The support preferably has a refractive index of at least 1.2, 1.4 or 1.5 at a wavelength of 550 nm. This makes it possible, for identical substrate structure, to increase the amount of light transmitted or emitted.

The term "support" denotes not only the support as such but also any structure comprising the support as well as at least one layer of a material having a refractive index $n_{material}$ close to the refractive index of the support $n_{support}$, in other words $|n_{support}-n_{material}| \leq 0.1$, $|n_{support}-n_{material}|$ representing the absolute value of the difference between the refractive indices. We may mention, as an example, a layer of silicon oxide deposited on a support of soda-lime-silica glass.

The support may include additional devices promoting extraction of light on one or both of its faces. One of these devices, namely a diffusion layer, is described in the published documents WO2009/017035, WO2009/116531, WO2010/084922, WO2010/084925, WO2011/046156, WO2011/046190 and the application PCT/JP2011/074358, all incorporated here by reference. Generally, this diffusion layer has a thickness greater than 5 μm and is not regarded as a coherent optical system. In the case when a diffusion layer of this kind is in contact with the electrode according to the invention, $n_{support}$ is then considered to be the index, optionally of the matrix, of this diffusion layer.

Alternatively, it may be desirable to avoid or minimize the scatter of the support. The substrate according to the invention may thus exhibit a haze value below 20%, more preferably below 10%, or even more preferably below 2% or below 1%. The advantage is that the organic device incorporating a substrate of this kind has an attractive, non-milky appearance when it is switched off. A mirror-like appearance may for example be obtained if the second electrode of opposite charge is reflective; or it is possible to make a transparent glazing assembly if the second electrode is also semitransparent.

In the case of a reflective second electrode, the complete organic device may then have reflection of light (according to CIE, illuminant D65 2°), measured on the support side, greater than 20%, or more preferably greater than 40% or even more advantageously greater than 60%. In the case of a semitransparent second electrode, the complete organic device may then have transmission of light of at least 5% (according to CIE, illuminant D65 2°), or more advantageously at least 10% or even more preferably at least 20%.

The function of the support is to support and/or protect the electrode. The support may be of glass, of rigid plastic (for example: organic glass, polycarbonate) or of flexible polymer films (for example: PVC, PET, PP, PTFE). The support is preferably rigid. Alternatively, it may be rolled up on itself (for example an extra-thin flexible glass usable in a roll-to-roll deposition process).

When the support is of glass, for example a sheet of glass, the latter preferably has a geometric thickness of at least 0.05 mm. The glass is preferably soda-lime-silica glass, clear or colored in the bulk or on the surface. Advantageously, it may be extra-clear, i.e. glass with a total iron content, expressed as $Fe_2O_3$, of less than 0.020 wt %, preferably of less than 0.015 wt %. Owing to its low porosity, glass has the advantage of providing good protection against any form of contamination of a device comprising the transparent substrate according to the invention.

The electrode according to the invention consists of a stack of layers comprising at least, in order starting from the substrate, a first dielectric layer (D1), a first metallic conduction layer (M1), a second dielectric layer (D2), a second metallic conduction layer (M2) and a third dielectric layer (D3). The electrode may behave as an anode or, conversely, as a cathode.

There are two metallic conduction layers in the electrode according to the invention. This makes it possible to reduce the problems of angular stability of the color emitted by the OLED device.

The metallic conduction layers of the electrode mainly provide electrical conduction of said electrode. They comprise at least one layer comprising a metal or a mixture of metals. The metal and/or the mixture of metals preferably comprises at least one element selected from Ag, Au, Pd, Pt, Al, Cu, Zn, Cd, In, Si, Zr, Mo, Ni, Cr, Mg, Mn, Co, Sn. Preferably, the metal and/or the mixture of metals comprises at least one element selected from Ag, Au, Cu, Al. More preferably, the metallic conduction layer comprises at least silver in pure form or alloyed with another metal, preferably selected from Pd and Au.

The geometric thickness of the first metallic conduction layer (M1) is at least 8.5 nm, preferably at least 8.7 nm or at least 9.0 nm, more preferably at least 9.5 nm. Preferably, the geometric thickness of the first metallic conduction layer (M1) is less than 13.0 nm, preferably less than 12.5 nm or less than 12.0 nm, more preferably less than 11.5 nm.

The geometric thickness of the second metallic conduction layer (M2) is at least 6.0 nm, preferably at least 7.0 nm or at least 7.5 nm, more preferably at least 8.0 nm. Preferably, the geometric thickness of the second metallic conduction layer (M2) is less than 25.0 or less than 20.0 nm, preferably less than 18.0 nm or less than 15.0 nm, more preferably less than 13.0 nm.

Advantageously, the total geometric thickness of the two metallic conduction layers of the electrode, i.e. the sum of the geometric thickness of the first metallic conduction layer (M1) and the geometric thickness of the second metallic conduction layer (M2), is less than 30.0 nm, preferably at most 29.0 nm, more preferably at most 28.0 nm. These values mean that the multilayer electrode does not absorb too much of the light emitted by the OLED system.

The dielectric layers may comprise one or more sublayers of different natures. Advantageously, they comprise a compound having a refractive index at a wavelength of 550 nm of at least 1.6, at least 1.8 or at least 1.9, and/or at most 2.7 or at most 2.5. Preferably, they have a refractive index that is greater than that of the support by at least 0.1, preferably by at least 0.2.

Preferably, the dielectric layers comprise at least one compound selected from:
- the oxides of at least one element selected from Y, Ti, Zr, Hf, V, Nb, Ta, Cr, Mo, W, Zn, Al, Ga, In, Si, Ge, Sn, Sb and Bi, as well as mixtures of at least two of them;
- silicon nitride, silicon oxynitride, silicon oxycarbide, silicon oxycarbonitride, aluminum nitride, aluminum oxynitride as well as mixtures of at least two of them.

Even more preferably, they comprise at least one compound selected from oxides of zinc, oxides of tin, oxides of titanium, nitrides of aluminum, nitrides of silicon, mixtures of at least two of them, zinc-tin mixed oxides and titanium-zirconium-yttrium mixed oxides.

The geometric thickness of the second dielectric layer (D2) is at least 65 nm, preferably at least 67 nm or at least 70 nm, more preferably at least 73 nm. Advantageously the geometric thickness of the second dielectric layer (D2) is less than 90 nm, preferably less than 88 nm or less than 86 nm.

Moreover, we found that additional selection at the level of the thicknesses of the second dielectric layer (D2) and of the first metallic conduction layer (M1) or of the thickness of the first dielectric layer (D1) could aim at the same general objectives of the invention.

Thus, the geometric thickness of the second dielectric layer, Tk.D2, and the geometric thickness of the first metallic conduction layer, Tk.M1, may satisfy the following equation:

$$Tk.M1 \geq -6.266386 + 0.1869915 * Tk.D2 + 0.0123539 * (Tk.D2 - 83.45)^2 - 0.0001814 * (Tk.D2 - 83.45)^3$$

Preferably, the ratio of the geometric thickness of the second dielectric layer to the geometric thickness of the first dielectric layer, Tk.D2/Tk.D1, is at least 1.90 or more preferably at least 1.95 or at least 2.00.

Also advantageously, the geometric thickness of the first dielectric layer, Tk.D1, may be at least 54 or at least 55 nm. It may be less than 80, less than 70 or less than 65 nm. A thicker first dielectric layer may contribute to lowering the sensitivity of the electrode with respect to the migration of alkaline species originating from the substrate.

According to the invention, the last dielectric layer of the electrode, the one farthest from the support, i.e. the third dielectric layer (D3), does not comprise a layer based on indium oxide (for example ITO). More preferably, none of the dielectric layers of the electrode comprises a layer based on indium oxide. In fact the use of indium poses a certain number of problems. Firstly, indium resources are limited, which will soon lead to an inevitable increase in the cost of production of these devices. Moreover, indium present in organic electroluminescent devices has a tendency to diffuse into the organic part of these devices, leading to shortening of their life.

The geometric thickness of the third and last dielectric layer of the electrode is preferably at least 5 nm or at least 8 nm, more preferably at least 10 nm. Preferably, it is less than 30 nm or preferably less than 25 nm, more preferably less than 22 nm, less than 20 nm or less than 18 nm.

Alternatively, the thickness of the last dielectric layer of the electrode may be defined by its ohmic thickness. The ohmic thickness of a layer is equal to the ratio of the resistivity (p) of the material constituting this layer to the geometric thickness of this same layer. Preferably the ohmic thickness of the last dielectric layer of the electrode is at most $10^{12}$ Ohm, preferably at most $10^7$ Ohm. Such values make it possible to optimize the optical parameters of the last dielectric layer of the electrode and therefore optimize the amount of light transmitted while maintaining a thickness compatible with electrical properties that make it possible to avoid high ignition voltages.

In general, when values of geometric thickness are given here for the layers D1, D2 or D3 of the electrode, they are given for a constituent material having a refractive index between 1.8 and 2.2, more preferably between 1.9 and 2.1 or even more preferably between 1.95 and 2.05 at a wavelength of 550 nm. They therefore correspond to an optical thickness equal to the geometric thickness multiplied by this refractive index, which is close to 2. If another material is chosen, with a different refractive index, it is sufficient to recalculate a corresponding geometric thickness.

Advantageously, the dielectric layers of the electrode under one, several or each of the metallic conduction layers may also comprise a nucleation layer contiguous with the face of the metallic conduction layer closest to the support. This layer allows preferential growth of the metallic layer, for example of silver, constituting the metallic conduction layer and so makes it possible to obtain good electrical and optical properties of the metallic conduction layer, for example by limiting the absorptivity of the stack. It preferably comprises at least ZnO (with x≤1) and/or $Zn_xSn_yO_z$ (with x+y≥3 and z≤6). Preferably, $Zn_xSn_yO_z$ comprises at most 95 wt % of zinc, the percentage by weight of zinc being expressed relative to the total weight of the metals present in the layer. Preferably, the crystallization layer is of ZnO. The geometric thickness of the nucleation layer is advantageously at least 5 or at least 8 nm; it is advantageously at most 15 or at most 12 nm. This thickness is included in the thickness of the dielectric that contains it.

It may also be advantageous to provide one, several or each of the metallic conduction layers with a protective barrier layer on top of the latter, i.e. on the face of the metallic conduction layer farthest from the support. This layer makes it possible to avoid deterioration of the metallic conduction layer, notably by oxidation or nitriding. It may comprise a metal, a nitride, an oxide or a sub-stoichiometric oxide comprising at least one element selected from Ti, Zr, Hf, V, Nb, Ta, Cr, Mo, W, Mn, Fe, Co, Ni, Cu, Zn and Al. Most preferably, the sacrificial layer comprises at least Ti, $TiO_x$ (with x≤2), TiN, NiCr, $NiCrO_x$, $TiZrO_x$ ($TiZrO_x$ indicates a layer of titanium oxide with 50 wt % of zirconium oxide), or $ZnAlO_x$ ($ZnAlO_x$ indicates a layer of zinc oxide with 2 to 5 wt % of aluminum oxide). Preferably, the barrier layer is a so-called "ceramic" layer, i.e. it is obtained from a ceramic target. Choosing a ceramic barrier may prove advantageous for avoiding parasitic absorption, which reduces the efficiency of the optoelectronic device. The geometric thickness of the barrier layer is advantageously at least 0.4 or at least 0.5 nm; it is advantageously at most 7.0 or at most 6.0 nm.

Advantageously, the electrode comprises a thin layer for improving the uniformity of the surface electrical properties, located, relative to the support, at the top of the multilayer stack making up said electrode. The main function of the thin layer for improving the uniformity of the surface electrical properties is to make it possible to obtain uniform charge transfer over the whole surface of the electrode. This uniform transfer is reflected in a luminous flux emitted or converted that is substantially equivalent at every point of the surface. This also makes it possible to increase the life of the photonic devices, since this transfer is substantially the same at every point, thus eliminating possible hot spots. The layer for improving uniformity has a geometric thickness of at least 0.5 nm, preferably of at least 1.0 nm. The layer for improving uniformity has a geometric thickness of at most 6.0 nm, preferably at most 2.5 nm, more preferably at most 2.0 nm. The layer for improving uniformity comprises at least a metal, a nitride, an oxide, a carbide, an oxynitride, an oxycarbide, a carbonitride or an oxycarbonitride. More preferably, the thin layer for improving the uniformity of the surface electrical properties comprises at least a Ti oxynitride, a Zr oxynitride, an Ni oxynitride, an NiCr oxynitride, a Ti nitride, a Zr nitride, an Ni nitride, or an NiCr nitride.

In certain particular embodiments, the transparent substrate according to the invention is such that the support has a functional coating located on the face opposite the face on which the electrode is deposited. This functional coating may be a layer or a stack of several layers with, for example, antireflective, diffusing, antimisting, antisoiling, scratch-resistant or selective absorption function.

According to another of its aspects, the present invention relates to an organic electroluminescent device comprising a transparent substrate as described above and a system of organic electroluminescent layers (OLED system) emitting white light, adjacent to the electrode of the transparent substrate.

So that an OLED system emits white light, it may be formed of a mixture within a single organic layer of compounds emitting red, green, yellow and blue light; by stacking three or four structures of organic layers corresponding respectively to the parts emitting red, green, yellow and blue light or of two structures of organic layers (yellow and blue emission); or by juxtaposition of three or four (red, green, blue and yellow emission) or two structures of organic layers (yellow and blue emission) associated or not with a light scattering system. When reference is made to a stack of organic layers, the latter may be contiguous (these structures are called "thin") or separated by layers for transport of electrons and holes (these structures are called "thick" and may be called "conventional high-performance organic stacks").

The term "white light" denotes light whose chromatic coordinates at 0°, for radiation perpendicular to the surface of the substrate, are included within one of the eight chromaticity quadrilaterals, inclusive of the contours of the quadrilaterals. These quadrilaterals are defined on pages 10 to 12 of standard ANSI_NEMA_ANSLG C78.377-2008. These quadrilaterals are shown in Fig. A1, PART 1 titled "Graphical representation of the chromaticity specification of SSL products in Table 1, on the CIE (x,y) chromaticity diagram".

Usually, G represents the emitting organic layer predominantly emitting green light, B represents the emitting organic layer predominantly emitting blue light and R represents the emitting organic layer predominantly emitting red light. The sequences GBR, RGB, BRG, RBG, GRB, BGR are the sequences in which the different emitting layers appear; these sequences are expressed relative to the electrode, the first letter of the sequence corresponding to the emitting layer farthest from said electrode. The organic layers may consist of a layer of a single material or a plurality of layers each of a different material. It is also possible to use systems with four emitting layers, where the yellow color (represented by the letter Y) makes it possible to extend the spectral coverage of visible light of the OLED system.

The organic electroluminescent devices according to the invention may include an OLED system selected from the GBR, RGB, BRG, RBG, GRB and BGR systems; the GBR and RGB systems are preferred. The organic electroluminescent devices according to the invention may also include an OLED system selected from the BYRG, BRYG systems and variants thereof; the BYRG or BYGR systems are preferred. Preferably, the organic electroluminescent devices according to the invention include an OLED system formed from a conventional high-performance organic stack comprising organic layers, separating at least two of the different emitting layers, which have a thickness of at least 5 nm, more preferably of at least 15 nm, or even more preferably of at least 30 nm.

An example of a so-called "thin" structure and the associated materials for fabricating a so-called "thick" structure are described for example in Reineke et al. (NATURE, Vol. 459, 14 May 2009) or in Rosenow et al. (Journal of Applied Physics, Vol. 108, 113113 (2010).

According to a particular embodiment, the organic electroluminescent device is integrated in glazing, double glazing or laminated glazing. It is also possible to integrate several organic electroluminescent devices.

According to another particular embodiment, the organic electroluminescent device is enclosed in at least one encapsulating material of glass and/or of plastic. The various embodiments of the organic electroluminescent devices may be combined.

Finally, the various organic electroluminescent devices have a wide range of application. The invention notably relates to the possible uses of these organic electroluminescent devices for making one or more luminous surfaces. The term luminous surface comprises for example lighting slabs, luminous panels, luminous partitions, work surfaces, greenhouses, flashlights, screen backing, drawer bottoms, luminous roofs, touch screens, lamps, photoflash, luminous display boards, safety signs, shelves, lighting for the passenger compartment of automobiles or the cockpit of aircraft.

The organic electroluminescent devices according to the invention advantageously have, in combination:
  a CRI above 70, preferably above 72 or above 74,
  a color Delta below 2.4, preferably below 2.0 or below 1.8, and
  a luminance equivalent to at least 75%, preferably at least 85% or 88%, or even more preferably at least 90% or 95%, of the luminance of the same OLED device, this time optimized with an electrode of ITO having a geometric thickness of 120 nm and a resistance per square of $12\Omega/\square$ ($\pm 0.5\Omega/\square$).

The organic electroluminescent devices according to the invention may also advantageously have an efficiency above 15 lumen/W at a luminance of 10000 $cd/m^2$.

Moreover, the organic electroluminescent devices according to the invention advantageously incorporate an electrode having a resistance per square well below that of the conventional ITO electrodes or multilayers with a single layer of silver, thus promoting conduction of the electrode and therefore the efficiency of the OLED device. The resistance per square of the electrode may be below $5.0\Omega/\square$, preferably below $4.0\Omega/\square$. This also allows the design of OLED devices of larger area without additional electrode reinforcement.

Particular embodiments of the invention will now be described, as examples, referring to FIGS. 1 and 2 and to examples 1 to 5. Comparative examples 1 to 12, not forming part of the invention, are also presented.

Figure 2:
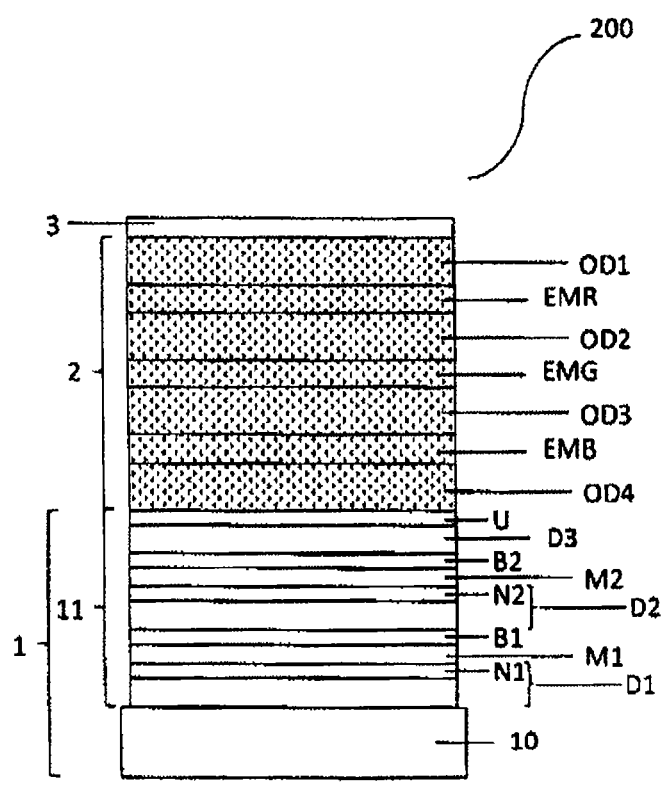

FIG. 1: cross section of an organic electroluminescent device according to the invention FIG. 2: cross section of another organic electroluminescent device according to the invention The organic electroluminescent device (100) of FIG. 1 comprises a transparent substrate (1), an OLED system (2) and a counterelectrode (3), the transparent substrate (1) comprising a support (10) carrying an electrode (11). Said electrode (11) consists of a stack of layers comprising a first dielectric layer (D1), a first metallic conduction layer (M1), a second dielectric layer (D2), a second metallic conduction layer (M2) and a third dielectric layer (D3).

The organic electroluminescent device (200) of FIG. 2 comprises a transparent substrate (1), an OLED system (2) and a counterelectrode (3), the transparent substrate (1) comprising a support (10) carrying an electrode (11). Said electrode (11) consists of a stack of layers comprising a first dielectric layer (D1) which includes a nucleation layer (N1), a first metallic conduction layer (M1), a barrier layer (B1), a second dielectric layer (D2) including a nucleation layer (N2), a second metallic conduction layer (M2), a barrier layer (B2), a third dielectric layer (D3) and a thin layer for improving uniformity (U). The OLED system (2) comprises, in order starting from the support (10), a first organic layer (OD4) including a layer for transport of holes, a blue emitting layer (EMB), a second organic layer (OD3) including a layer for transport of electrons and a layer for transport of holes, a green emitting layer (EMG), a third organic layer (OD2) including a layer for transport of electrons and a layer for transport of holes, a red emitting layer (EMR), and a fourth organic layer (OD1) including a layer for transport of electrons. This OLED system is called "RGB". One or more blocking layer(s) (not shown in FIG. 2) may also be provided in the OLED system in one or more charge-transporting layer(s).

The various elements in the figures are not shown to scale.

Examples of organic electroluminescent devices according to the invention are presented in Table I, and comparative examples, not forming part of the invention, are presented in Table II.

For each part of the organic electroluminescent device, the layers forming the electrode and the organic system are described there: their nature, and their geometric thickness expressed in nanometers. The light emitted by the OLED system is also defined.

$Zn_{90}Sn_{10}O$ represents a mixed oxide of Zn (90 wt %) and Sn (10 wt %)

$Zn_{48}Sn_{52}O$ represents a mixed oxide of Zn (48 wt %) and Sn (52 wt %)

TxO represents a layer of $TiO_2$ deposited by magnetron spraying using a ceramic target ITO represents a layer of tin-doped indium oxide All the organic electroluminescent devices of the examples and comparative examples have a support of soda-lime-silica glass.

The resistance per square of the electrode, expressed in $\Omega/\square$, as well as the performance of the organic electroluminescent devices of the examples and comparative examples are given in Tables I and II. The performance was calculated using the SETFOS simulation software (Semiconducting Emissive Thin Film Optics Simulator) from the company Fluxim (http://www.fluxim.ch), Version 2. The luminance (Lum) is expressed in arbitrary units. The values of CRI given are mean values of CRI calculated at angles of 0, 10, 20, . . . , 80 degrees from the above formula. The values of color Delta (Deltacol) were also calculated from the formula given above. The luminance is also expressed relatively ("ratio") relative to the reference luminance of the same OLED device optimized with an electrode of ITO ("reference") for which the refractive indices are obtained from the file ITO.nk available in SETFOS.

The performance of the examples shows an excellent combination of the values of luminance, CRI and color Delta, with a luminance above 80, a luminance equivalent to at least 88% of the luminance of the same OLED device optimized with a reference ITO electrode, a CRI above 70 and a color Delta below 2. Moreover, the electrodes according to the invention have a resistance per square well below that of the conventional ITO electrodes or multilayers with a single layer of silver, thus promoting conduction of the electrode, and therefore the efficiency of the OLED device, which also allows the design of OLEDs of larger area without electrode reinforcement. However, for each of the comparative examples, at least one of these performance figures shows an unacceptable value (value underlined in Table II).

TABLE I

| | | | ELECTRODE | | | | | | | OLED | | |
|---|---|---|---|---|---|---|---|---|---|---|---|---|
| | D1 | | M1 | B1 | D2 | | M2 | B2 | D3 | U | OD4 | EM | OD3 |
| 1 | $Zn_{90}Sn_{10}O$ 35.0 | | Ag 10.2 | TxO 0.5 | $Zn_{90}Sn_{10}O$ 79.3 | | Ag 8.0 | TxO 0.5 | $Zn_{48}Sn_{52}O$ 10.0 | | 112 | B 25 | 74 |
| 2 | $Zn_{90}Sn_{10}O$ 38.7 | | Ag 10.4 | TxO 0.5 | $Zn_{90}Sn_{10}O$ 71.9 | | Ag 8.0 | TxO 0.5 | $Zn_{48}Sn_{52}O$ 10.0 | | 100 | R 25 | 32 |
| 3 | $Zn_{90}Sn_{10}O$ 32.0 | | Ag 9.8 | TxO 0.5 | $Zn_{90}Sn_{10}O$ 74.5 | | Ag 8.0 | TxO 0.5 | $Zn_{48}Sn_{52}O$ 10.0 | | 83 | B 25 | 30 |
| 4 | $Zn_{90}Sn_{10}O$ 38.7 | | Ag 9.7 | TxO 0.5 | $Zn_{90}Sn_{10}O$ 70.3 | | Ag 8.0 | TxO 0.5 | $Zn_{48}Sn_{52}O$ 10.0 | | 116 | R 25 | 40 |
| 5 | $Zn_{48}Sn_{52}O$/ZnO 38.5/10.0 | | Ag 10.3 | TxO 0.5 | $Zn_{48}Sn_{52}O$/ZnO 66.3/10.0 | | Ag 8.0 | TxO 0.5 | $Zn_{48}Sn_{52}O$ 6.6 | TiN 1.5 | 109 | B 25 | 70 |

| | OLED | | | | | Performance | | | Lum ratio vs. ITO | |
|---|---|---|---|---|---|---|---|---|---|---|
| | EM | OD2 | EM | OD1 | light emitted | R/□ ($\Omega/\square$) | Lum | CRI | Deltacol | Ratio | Reference |
| 1 | G 25 | 92 | R 25 | 42 | Planck | 3.5 | 85.1 | 78.7 | 0.82 | 95% | Comp. Ex. 1 |
| 2 | B 25 | 57 | G 25 | 51 | Planck | 3.5 | 86.7 | 79.7 | 1.23 | 95% | Comp. Ex. 2 |

TABLE I-continued

| | | | | | Examples | | | | | | |
|---|---|---|---|---|---|---|---|---|---|---|---|
| 3 | G | | R | | illuminant A | 3.6 | 88.1 | 74.6 | 1.66 | 99% | Comp. Ex. 1 |
| | 25 | 120 | 25 | 40 | | | | | | | |
| 4 | B | | G | | illuminant A | 3.6 | 86.3 | 76.0 | 1.50 | 95% | Comp. Ex. 2 |
| | 25 | 46 | 25 | 50 | | | | | | | |
| 5 | G | | R | | Planck | 3.5 | 81.6 | 81.8 | 1.02 | 92% | Comp. Ex. 1 |
| | 25 | 119 | 25 | 35 | | | | | | | |

TABLE II

Comparative examples

| | ELECTRODE | | | | | | | | OLED | | |
|---|---|---|---|---|---|---|---|---|---|---|---|
| | D1 | M1 | B1 | D2 | M2 | B2 | D3 | U | OD4 | EM | OD3 |
| 1 | ITO 120.0 | | | | | | | | 77 | B 25 | 41 |
| 2 | ITO 120.0 | | | | | | | | 123 | R 25 | 31 |
| 3 | ITO 120.0 | | | | | | | | 45 | B 4 | |
| 4 | TiO$_2$/ZnSnO 60.0/10.0 | Ag 13.0 | Ti 2.5 | ZnSnO 7.0 | | | | TiN 2.0 | 87 | B 25 | 120 |
| 5 | Si$_3$N$_4$/SnZnO/ZnO 21.0/5.0/5.0 | Ag 12.0 | Ti 0.5 | ITO 10 | | | | | 45 | B 4 | |
| 6 | Si$_3$N$_4$/SnZnO/ZnO 30.0/5.0/5.0 | Ag 8.0 | Ti 0.5 | ZnO/SnZnO/ZnO 5.0/60.0/5.0 | Ag 8.0 | Ti 0.5 | ITO 20 | | 45 | B 4 | |
| 7 | Si$_3$N$_4$/SnZnO/ZnO 30.0/5.0/5.0 | Ag 8.0 | Ti 0.5 | ZnO/SnZnO/ZnO 5.0/60.0/5.0 | Ag 8.0 | Ti 0.5 | ITO 20 | | 63 | B 25 | 30 |
| 8 | Si$_3$N$_4$/SnZnO/ZnO 23.0/7.0/2.5 | Ag 9.0 | Ti 0.5 | ZnO/SnZnO/ZnO 5.0/45.0/5.0 | Ag 8.0 | Ti 0.5 | ITO 22 | | 45 | B 4 | |
| 9 | Si$_3$N$_4$/SnZnO/ZnO 23.0/7.0/2.5 | Ag 9.0 | Ti 0.5 | ZnO/SnZnO/ZnO 5.0/45.0/5.0 | Ag 8.0 | Ti 0.5 | ITO 22 | | 102 | B 25 | 33 |
| 10 | Si$_3$N$_4$/SnZnO/ZnO 26.0/4.0/5.0 | Ag 11.0 | Ti 0.5 | ZnO/SnZnO/ZnO 5.0/50.0/2.5 | Ag 8.0 | Ti 0.5 | ITO 18 | | 45 | B 4 | |
| 11 | Si$_3$N$_4$/SnZnO/ZnO 15.0/5.0/5.0 | Ag 9.0 | Ti 0.5 | ZnO/SnZnO/ZnO 5.0/40.0/5.0 | Ag 8.0 | Ti 0.5 | ITO 32 | | 45 | B 4 | |
| 12 | Zn$_{48}$Sn$_{52}$O/ZnO 35.1/10.0 | Ag 8.6 | TxO 0.5 | Zn$_{48}$Sn$_{52}$O/ZnO 49.8/10.0 | Ag 9.4 | TxO 0.5 | Zn$_{48}$Sn$_{52}$O 7.1 | TiN 1.5 | 99 | B 25 | 65 |

| | OLED | | | | Performance | | | | | |
|---|---|---|---|---|---|---|---|---|---|---|
| | EM | OD2 | EM | OD1 | light emitted | R/□ (Ω/□) | Lum | CRI | Deltacol | Lum ratio vs. ITO Ratio | Reference |
| 1 | G 25 | 115 | R 25 | 54 | illuminant A | 12.3 | 89.1 | 73.7 | 2.40 | 100% | — |
| 2 | B 25 | 48 | G 25 | 56 | illuminant A | 12.3 | 91.0 | 65.8 | 1.08 | 100% | — |
| 3 | G 6 | | R 1 | 50 | illuminant E | 12.3 | 78.9 | 74.4 | 3.88 | 100% | — |
| 4 | G 25 | 59 | R 25 | 35 | Planck | 4.9 | 38.2 | 71.6 | 7.43 | 43% | Comp. Ex. 1 |
| 5 | G 6 | | R 1 | 50 | illuminant E | 5.4 | 117.2 | 58.3 | 6.64 | 149% | Comp. Ex. 3 |
| 6 | G 6 | | R 1 | 50 | illuminant E | 4.0 | 81.0 | 64.9 | 0.73 | 103% | Comp. Ex. 3 |
| 7 | G 25 | 118 | R 25 | 49 | Planck | 4.0 | 85.3 | 79.1 | 2.83 | 94% | Comp. Ex. 1 |
| 8 | G 6 | | R 1 | 50 | illuminant E | 3.8 | 68.4 | 56.0 | 2.63 | 87% | Comp. Ex. 3 |
| 9 | G 25 | 46 | R 25 | 65 | illuminant A | 3.8 | 78.6 | 78.2 | 3.32 | 88% | Comp. Ex. 1 |
| 10 | G 6 | | R 1 | 50 | illuminant E | 3.4 | 66.9 | 52.5 | 3.92 | 85% | Comp. Ex. 3 |
| 11 | G 6 | | R 1 | 50 | illuminant E | 3.4 | 56.1 | 60.4 | 4.97 | 71% | Comp. Ex. 3 |
| 12 | G 25 | 90 | R 25 | 71 | Planck | 3.5 | 82.5 | 70.2 | 3.38 | 93% | Comp. Ex. 1 |

Moreover, organic electroluminescent devices were fabricated effectively on the basis of example 5 and comparative examples 4 and 12; the external quantum efficiency (EQE) and the luminous efficiency of these devices were measured at 10000 cd/m$^2$; the CRI and the color Delta of these devices were measured at 1000 cd/m$^2$.

The device according to example 5, according to the invention, shows an external quantum efficiency of 22.4%, a luminous efficiency of 14 lm/W, a CRI above 86 and a color Delta of 2.15.

The device according to comparative example 4, not according to the invention, in which the electrode is a multilayer with a single layer of silver, shows an external quantum efficiency of 16.6%, a luminous efficiency of 13.1 lm/W, a CRI of 61 and a color Delta of 8.9.

The device according to comparative example 12, not according to the invention, in which the electrode is a multilayer with two layers of silver, but whose thickness of D2, 59.8 nm, is less than 65 nm, shows an external quantum efficiency of 16.6%, a luminous efficiency of 10.8 lm/W, a CRI of 82 and a color Delta of 3.68.

Other stackings of layers according to the invention were also carried out to study the influence of the thickness of the third dielectric. They are presented here as examples 6 to 9. Only the third dielectrics and optionally the layer for improving uniformity differentiate these examples, according to the structures given in Table III. These examples illustrate the preference for a third dielectric with thickness less than 30 nm, allowing a lower ignition voltage to be obtained, which may prove advantageous.

TABLE III

| Examples | D3 | U | Ignition voltage [V] @ 10 mA/cm$^2$ |
|---|---|---|---|
| 6 | Zn—Sn mixed oxide 33 nm | — | 6.2 |
| 7 | Zn—Sn mixed oxide 33 nm | TiN 0.5 nm | 5.9 |
| 8 | Zn—Sn mixed oxide 12 nm | — | 3.4 |
| 9 | Zn—Sn mixed oxide 6 nm | — | 3.2-3.4 |

The invention claimed is:

1. A transparent substrate comprising:
a support carrying an electrode which transmits light from a light emitter disposed on an opposite side of the electrode from the support, said electrode having a stack of layers comprising, in order starting from the substrate, a first dielectric layer, a first metallic conduction layer, a second dielectric layer, a second metallic conduction layer, and a third dielectric layer,
wherein
the number of metallic conduction layers in the electrode is two, and the third dielectric layer does not comprise a layer based on indium oxide,
and wherein a geometric thickness of the second dielectric layer is at least 65 nm and a geometric thickness of the first metallic conduction layer is at least 8.5 nm, and
a geometric thickness of the third dielectric layer is less than 20 nm.

2. The transparent substrate according to claim 1, wherein the geometric thickness of the second dielectric layer is less than 90 nm.

3. The transparent substrate according to claim 1, wherein the geometric thickness of the first metallic conduction layer is less than 13 nm.

4. The transparent substrate according to claim 1, wherein the geometric thickness of the second dielectric layer, Tk.D2, and the geometric thickness of the first metallic conduction layer, Tk.M1, satisfy the following equation:

$$Tk.M1 \geq -6.266386 + 0.1869915 * Tk.D2 + 0.0123539 * (Tk.D2 - 83.45)^2 - 0.0001814 * (Tk.D2 - 83.45)^3.$$

5. The transparent substrate according to claim 1, wherein a ratio of the geometric thickness of the second dielectric layer to a geometric thickness of the first dielectric layer, Tk.D2/Tk.D1, is at least 1.90.

6. The transparent substrate according to claim 1, wherein a geometric thickness of the first dielectric layer, Tk.D1, is at least 54 nm.

7. The transparent substrate according to claim 1, wherein a geometric thickness of the third dielectric layer is between 5 and 18 nm.

8. The transparent substrate according to claim 1, wherein the metallic conduction layers of the electrode comprise silver.

9. The transparent substrate according to claim 1, wherein a total geometric thickness of the two metallic conduction layers of the electrode, Tk.M1+Tk.M2, is less than 30.0 nm.

10. The transparent substrate according to claim 1, wherein the dielectric layers of the electrode comprise a compound with a refractive index of between 1.6 and 2.5 at a wavelength of 550 nm.

11. The transparent substrate according to claim 1, wherein the dielectric layers of the electrode comprise a compound selected from the group consisting of oxides of zinc, oxides of tin, oxides of titanium, nitrides of aluminum, nitrides of silicon, zinc-tin mixed oxides, titanium-zirconium-yttrium mixed oxides and mixtures thereof.

12. The transparent substrate according to claim 1, with the proviso that none of the dielectric layers comprise a layer based on indium oxide.

13. An organic electroluminescent device comprising the transparent substrate according to claim 1 and an OLED system emitting white light adjacent to the electrode of the transparent substrate.

14. The organic electroluminescent device according to claim 13, wherein it has a luminance equivalent to at least 85% of the luminance of the same OLED device optimized with an electrode of ITO having a geometric thickness of 120 nm and a resistance per square of 12Ω/☐ (±0.5Ω/☐), a CRI above 70 and a color Delta below 2.0.

* * * * *